US006451415B1

(12) United States Patent
Forrest et al.

(10) Patent No.: US 6,451,415 B1
(45) Date of Patent: Sep. 17, 2002

(54) ORGANIC PHOTOSENSITIVE OPTOELECTRONIC DEVICE WITH AN EXCITON BLOCKING LAYER

(75) Inventors: Stephen R. Forrest, Princeton; Vladimir Bulovic, Metuchen; Peter Peumans, Princeton, all of NJ (US)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 09/449,801

(22) Filed: Nov. 26, 1999

Related U.S. Application Data

(63) Continuation-in-part of application No. 09/136,342, filed on Aug. 19, 1998, now Pat. No. 6,352,777, and a continuation-in-part of application No. 09/136,166, filed on Aug. 19, 1998, now Pat. No. 6,297,495, and a continuation-in-part of application No. 09/136,377, filed on Aug. 19, 1998, now Pat. No. 6,278,055, and a continuation-in-part of application No. 09/136,165, filed on Aug. 19, 1998, now Pat. No. 6,198,092, and a continuation-in-part of application No. 09/136,164, filed on Aug. 19, 1998, now Pat. No. 6,198,091.

(51) Int. Cl.$^7$ ................................................ H01L 31/06

(52) U.S. Cl. ................... 428/212; 428/913; 136/252; 136/263; 313/523; 257/184; 257/461

(58) Field of Search ................ 136/243, 252, 136/263; 428/212, 913; 313/523; 257/184, 185, 461; 252/501.1

(56) References Cited

U.S. PATENT DOCUMENTS

| 5,121,183 A | | 6/1992 | Ogasawara et al. ............ 357/30 |
| 5,201,961 A | | 4/1993 | Yohsikawa et al. ......... 136/263 |
| 5,315,129 A | | 5/1994 | Forrest et al. ................. 257/21 |
| 5,350,459 A | | 9/1994 | Suzuki et al. ............... 136/263 |
| 5,652,067 A | * | 7/1997 | Ito et al. ....................... 428/690 |
| 5,703,436 A | | 12/1997 | Forrest et al. ............... 313/506 |
| 6,198,091 B1 | | 3/2001 | Forrest et al. ............ 250/214.1 |
| 6,198,092 B1 | | 3/2001 | Bulovic et al. .......... 250/214.1 |
| 6,278,055 B1 | * | 8/2001 | Forrest et al. ............... 136/263 |
| 6,297,495 B1 | * | 10/2001 | Bulovic et al. .......... 250/214.1 |
| 6,333,458 B1 | * | 12/2001 | Forrest et al. ............... 136/259 |
| 6,352,777 B1 | * | 3/2002 | Bulovic et al. ........... 428/411.1 |

OTHER PUBLICATIONS

M. Granström, et al., "Laminated fabrication of polymeric photovoltaic diodes", *Nature*, vol. 395, pp. 257–260 (Sep. 17, 1998).

G. Yu, et al., "Polymer Photovoltaic Cells: Enhanced efficiencies via a network of internal donor–acceptor heterojunctions", *Science*, vol. 270, pp. 1789–1791 (Dec. 15, 1995).

U. Bach, et al., Solid–state dye–sensitized mesoporous $TiO_2$ solar cells with high photon–to–electron conversion efficiencies, *Nature*, vol. 395, pp. 583–585 (Oct. 8, 1998).

A. Shah, et al., "Photovoltaic Technology: The case for thin–film solar cells", *Science*, vol. 285, pp. 692–698 (Jul. 30, 1999).

C.W. Tang, "Two–layer organic photovoltaic cell", *Appl. Phys. Lett.*, 48(2), pp. 183–185 (Jan. 13, 1986).

C. Arbour, et al., "Surface Chemistries and Photoelectrochemistries of Thin Film Molecular Semiconductor Materials", *Mol. Cryst. Liq. Cryst.*, vol. 183, 307–320 (1990) (No month).

(List continued on next page.)

*Primary Examiner*—Marie Yamnitzky
(74) *Attorney, Agent, or Firm*—Kenyon & Kenyon

(57) ABSTRACT

Organic photosensitive optoelectronic devices ("OPODs") which include an exciton blocking layer to enhance device efficiency. Single heterostructure, stacked and wave-guide type embodiments. Photodetector OPODs having multilayer structures and an exciton blocking layer. Guidelines for selection of exciton blocking layers are provided.

24 Claims, 12 Drawing Sheets

OTHER PUBLICATIONS

Y. Hirose, et al., "Chemistry and electronic properties of metal–organic semiconductor interfaces: Al, Ti, In, Sn, Ag, and Au on PTCDA", *Phys. Rev. B*, vol. 54, No. 19, pp. 13 748–13 758 (Nov. 15, 1996).

D.F. O'Brien, et al., "Improved energy transfer in electrophosphorescent devices", *Applied Physics Letters*, vol. 74, No. 3, pp. 442–444, (Jan. 18, 1999).

S.E. Burns, et al., "Measurements of optical electric field intensities in microcavities using thin emissive polymer films", *Adv. Mater.*, vol. 9, No. 5, pp. 395–397 (1997) (No month).

P.E. Burrows, et al., "Relationship Between Electroluminescence and Current Transport in organic heterojunction light–emitting devices", *J. Appl. Phys.*, vol. 79, No. 10, pp. 7991–8006 (May 15, 1996).

S.R. Forrest, "Ultrathin Organic Films Grown by Organic Molecular Beam Deposition and Related Techniques", *Chem. Rev.*, vol. 97, No. 6, 1793–1896 (Sep./Oct. 1997).

J.J. M. Halls, et al., Exciton diffusion and dissociation in a poly(p–phenylenevinylene)/$C_{60}$ heterojunction photovoltaic cell, *Appl. Phys. Lett.*, 68(22), pp. 3120–3122 (May 27, 1996).

L. A. A. Pettersson, et al., "Modeling photocurrent action spectra of photovoltaic devices based on organic thin films", *J. Appl. Phys.*, vol. 86, No. 1, pp. 487–496 (Jul. 1, 1999).

X. Deng, et al., "Improved $\mu$c–Si p–Layer and a–Si i–Layer materials using VHF plasma deposition", *$26^{th}$ IEEE PVSC Conf. Record*, pp. 591–594, IEEE Press, NY (Sep. 30–Oct. 3, 1997).

S.R. Wenham, et al., *Applied Photovoltaics*, Appendix B, Bridge Printery, Sydney (1994) (No month).

* cited by examiner

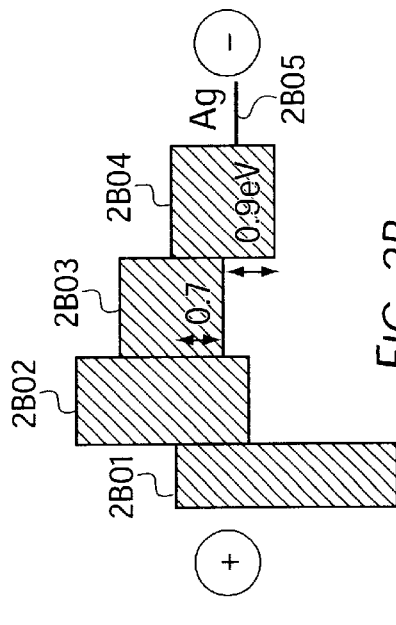
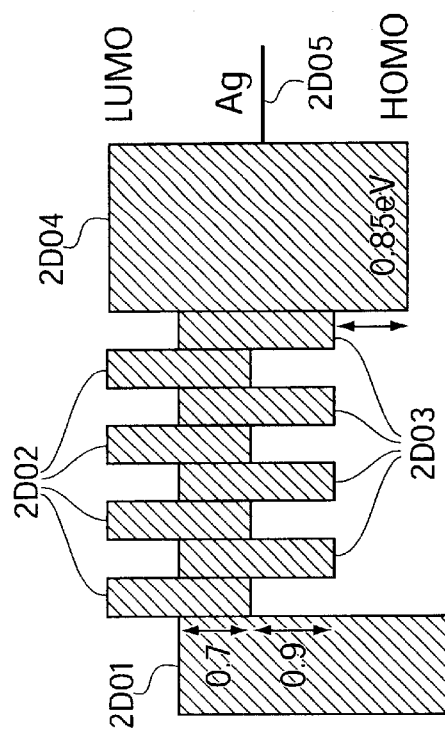
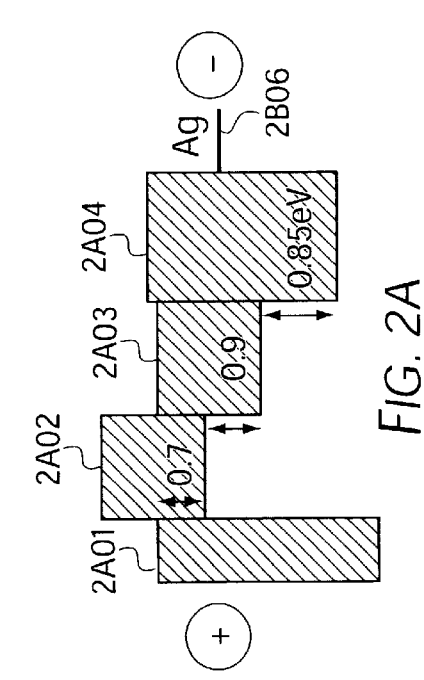
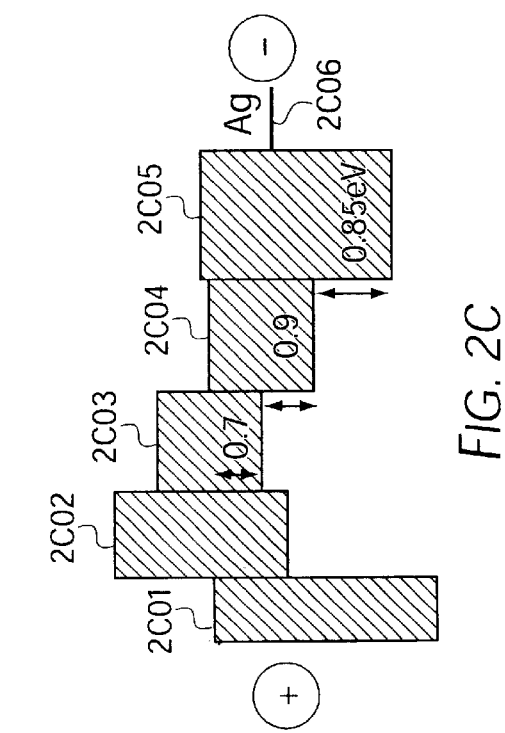

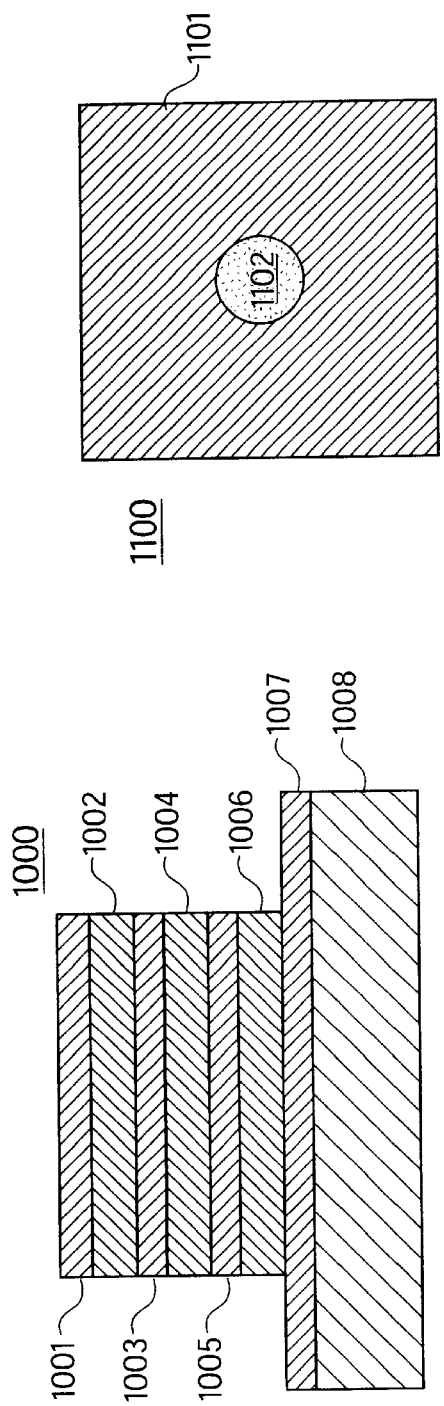
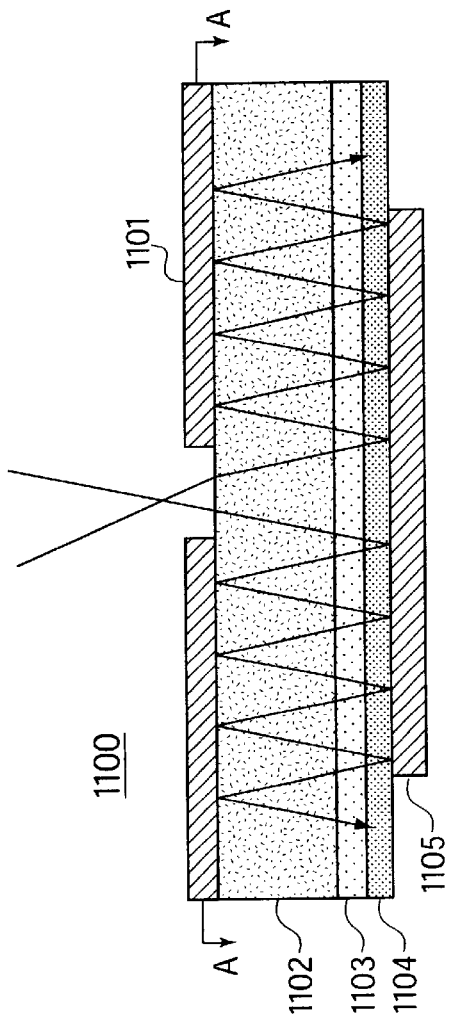
FIG. 10
FIG. 11
FIG. 12

ORGANIC PHOTOSENSITIVE OPTOELECTRONIC DEVICE WITH AN EXCITON BLOCKING LAYER

This is a continuation-in-part application of U.S. patent applications with Ser. Nos. 09/136,342, 09/136,166, 09/136,377, 09/136,165 and 09/136,164, each filed on Aug. 19, 1998, now U.S. Pat. Nos. 6,352,777, 6,297,495, 6,278,055, 6,198,092 and 6,198,091, respectively.

FIELD OF INVENTION

The present invention generally relates to organic thin-film photosensitive optoelectronic devices. More specifically, it is directed to organic photosensitive optoelectronic devices, e.g., solar cells and visible spectrum photodetectors, having an exciton blocking layer.

BACKGROUND OF THE INVENTION

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Solar cells, also known as photovoltaic (PV) devices, are specifically used to generate electrical power. PV devices are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system.

Traditionally, photosensitive optoelectronic devices have been constructed of a number of inorganic semiconductors, e.g. crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation of selected spectral energies to generate electric charge carriers. Solar cells are characterized by the efficiency with which they can convert incident solar power to useful electric power. Devices utilizing crystalline or amorphous silicon dominate commercial applications and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices typically have the property that when they are connected across a load and are irradiated by light they produce a photogenerated voltage. When irradiated without any external electronic load, a PV device generates its maximum possible voltage, V open-circuit, or $V_{oc}$. If a PV device is irradiated with its electrical contacts shorted, a maximum short-circuit current, or $I_{sc}$, is produced. When actually used to generate power, a PV device is connected to a finite resistive load and the power output is given by the current voltage product, I×V. The maximum total power generated by a PV device is inherently incapable of exceeding the product, $I_{sc} \times V_{oc}$. When the load value is optimized for maximum power extraction, the current and voltage have values, $I_{max}$ and $V_{max}$ respectively. A figure of merit for solar cells is the fill factor ff defined as:

$$ff = \frac{I_{max} V_{max}}{I_{SC} V_{OC}} \qquad (1)$$

where ff is always less than 1 since in actual use $I_{sc}$ and $V_{oc}$ are never obtained simultaneously. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \rightarrow S_0^*$. Here $S_0$ and $S_0^*$ denote ground and excited molecular states, respectively. This energy absorption is associated with the promotion of an electron from a bound state in the valence band, which may be a π-bond, to the conduction band, which may be a π*-bond, or equivalently, the promotion of a hole from the conduction band to the valence band. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other as opposed to recombination with holes or electrons from other pairs. To produce a photocurrent the electron-hole pair must become separated. If the charges do not separate, they can recombine in a geminant recombination process, also known as quenching, either radiatively—re-emitting light of a lower than incident light energy-, or non-radiatively—with the production of heat.

Either of these outcomes is undesirable in a photosensitive optoelectronic device. While exciton ionization, or dissociation, is not completely understood, it is generally believed to occur at defects, impurities, contacts, interfaces or other inhomogeneities. Frequently, the ionization occurs in the electric field induced around a crystal defect, denoted, M. This reaction is denoted $S_0^* + M \rightarrow e + h^+$. If the ionization occurs at a random defect in a region of material without an overall electric field, the generated electron-hole pair will likely recombine. To achieve a useful photocurrent, the electron and hole must be collected separately at respective opposing electrodes, which are frequently referred to as contacts. Exciton dissociation occurs either in high electric field regions by field-emission, or at an interface between, e.g., donor-like and acceptor-like materials such as copper phthalocyanine (CuPc) and 3,4,9,10-perylenetetracarboxylic-bis-benzimidazole (PTCBI), by charge transfer. The latter can be viewed as an exothermic chemical reaction, i.e., a reaction in which some energy is released as vibrational energy. This reaction occurs because the energy separation of the dissociated exciton, i.e., the energy difference between the free electron in, e.g., PTCBI, and the free hole in, e.g., CuPc, is smaller than the energy of the exciton prior to dissociation.

Electric fields or inhomogeneities at a contact may cause an exciton to quench rather than dissociate, resulting in no net contribution to the current. Therefore, it is desirable to keep photogenerated excitons away from the contacts. This has the effect of limiting the diffusion of excitons to the region near the junction so that the junction associated electric field has an increased opportunity to separate charge carriers liberated by the dissociation of the excitons near the junction.

Here appreciation should be taken of some of the distinctions between organic photosensitive optoelectronic devices (OPODs) and organic light emitting devices (OLEDs). In an OLED, a bias is applied to a device to produce a flow of holes and electrons into a device. In OLEDs, excitons are generally formed which in time may either recombine radiatively or nonradiatively. In OLEDs, maximum radiative recombination is the desired result. In OPODs maximum exciton generation and dissociation is the desired result. The differing objectives of the devices lead to differing selection of materials and layer thicknesses. OPOD photosensitive materials are chosen for their absorption properties while photoluminescent materials for OLEDs are chosen for their emissive properties.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photogenerated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

In addition to relative free-carrier concentrations, a significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Due to these unique electronic properties of organic materials, rather than designating them as "p-type" or "acceptor-type" and "n-type" or "donor-type", the nomenclature of "hole-transporting-layer" (HTL) or "electron-transporting-layer" (ETL) is frequently used. In this designation scheme, an ETL will preferentially be electron conducting and an HTL will preferentially be hole transporting. The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

The electrodes, or contacts, used in a photosensitive optoelectronic device are an important consideration. In a photosensitive optoelectronic device, it is desirable to allow the maximum amount of ambient electromagnetic radiation from the device exterior to be admitted to the photoconductively active interior region. That is, it is desirable to get the electromagnetic radiation to where it can be converted to electricity by photoconductive absorption. This often dictates that at least one of the electrical contacts should be minimally absorbing and minimally reflecting of the incident electromagnetic radiation. That is, such contact should be substantially transparent. When used herein, the terms "electrode" and "contact" refer only to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. The term "charge transfer layer" is used herein to refer to layers similar to but different from electrodes in that a charge transfer layer only delivers charge carriers from one subsection of an optoelectronic device to the adjacent subsection. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers which permit some but less that 50% transmission of ambient electromagnetic radiation in relevant wavelengths are said to be "semi-transparent".

Electrodes or contacts are usually metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV rendering it transparent to wavelengths greater than approximately 3900 Å. Another suitable metal substitute material is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that may be thought of as a type of chemical bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

A typical prior art photovoltaic device configuration is the organic bilayer cell. In the bilayer cell, charge separation predominantly occurs at the organic heterojunction. The built-in potential is determined by the HOMO-LUMO gap energy difference between the two materials contacting to form the heterojunction. The HOMO-LUMO energy levels for such a heterojunction are illustrated schematically in FIG. 1 where 101 represents an anode, 102 represents an HTL layer, 103 represents an ETL layer and 104 represents a cathode. The HOMO-LUMO gap offset between the HTL and ETL produce an electric field around the HTL/ETL interface.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It will be noted that as the terms are used herein anodes and cathodes may be electrodes or charge transfer layers.

Organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process, that is, carrier generation requires exciton generation, diffusion and ionization, as described above. In order to increase these yields, materials and device configurations are desirable which can enhance the quantum yield and, therefore, the power conversion efficiency.

Thompson et al. in U.S. patent application Ser. No. 09/311,126, now abandoned, for "Very High Efficiency Organic Light Emitting Devices Based on Electrophosphorescence" have described the use of an exciton blocking layer to confine excitons to the emission layer in an organic light emitting device (OLED) in order to increase the device efficiency. In the context of the present invention, an EBL is characterized by its ability to prevent the diffusion of excitons from an adjacent organic layer into or across the EBL. "Ultrathin Organic Films Grown by Organic Molecular Beam Deposition and Related Techniques", Chemical Reviews, Vol. 97, No. 6, 1997 (hereinafter Forrest, Chem. Rev. 1997) and Arbour, C., Armstrong, N. R., Brina, R., Collins, G., Danziger, J. -P., Lee, P., Nebesny, K. W., Pankow, J., Waite, S., "Surface Chemistries and Photoelectrochemistries of Thin Film Molecular Semiconductor Materials", Molecular Crystals and Liquid Crystals, 1990, 183, 307, (hereinafter Arbour et al.), disclose that alternating thin multilayer stacks of similar type photoconductors could be used to enhance photogenerated carrier collection efficiency over that using a single layer structure. Further, these sources describe multiple quantum well (MQW) structures in which quantum size effects occur when the layer thicknesses become comparable to the exciton dimensions.

SUMMARY AND OBJECTS OF INVENTION

Several guidelines must be kept in mind in designing an efficient organic photosensitive optoelectronic device. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive material thickness to be of the order of the electromagnetic radiation absorption length, $1/\alpha$ (where $\alpha$ is the absorption coefficient), so that nearly all of the radiation incident on the solar cell is absorbed to produce excitons. However, the thickness should not be so large compared to the extent of the heterojunction electric fields that many excitons get generated in a field-free region. One reason for this is that the fields help to dissociate the excitons. Another reason is that if an exciton dissociates in a field-free region, it is more likely to suffer geminant recombination, or quenching, and contribute nothing to the photocurrent. Further, electric fields may exist at the electrode/semiconductor interfaces. These fields at the electrode interfaces can also promote exciton quenching. Furthermore, the photoconductive layer thickness should be as thin as possible to avoid excess series resistance due to the high bulk resistivity of organic semiconductors.

On the other hand, another countervailing consideration is that as the separation between the exciton dissociating interface and the adjacent electrodes increases, the electric field region around the interface will have a higher value over a greater volume. Since light absorption increases with increasing electric field strength, more excitons will be generated. Also, the higher electric fields will also promote faster exciton dissociation.

It has been suggested that one means for circumventing the diffusion length limitation is to use thin cells with multiple or highly folded interfaces, such as can be achieved using nanotextured materials, polymer blends, closely spaced, repeated interfaces, or spatially distributed dissociation sites. To date, none of these proposals has led to a significant improvement in overall performance of solar cells, particularly at high illumination intensities.

Accordingly, in the present invention higher internal and external quantum efficiencies have been achieved by the inclusion in OPODs of one or more exciton blocking layers (EBLs) to confine photogenerated excitons to the region near the dissociating interface and prevent parasitic exciton quenching at a photosensitive organic/electrode interface. In addition to limiting the volume over which excitons may diffuse, an EBL can also act as a diffusion barrier to substances introduced during deposition of the electrodes. In some circumstances, an EBL can be made thick enough to fill pinholes or shorting defects which could otherwise render an OPOD non-functional. An exciton blocking layer can therefore help protect fragile organic layers from damage produced when electrodes are deposited onto the organic materials.

It is believed that the EBLs comprising the present invention derive their exciton blocking property from having a LUMO-HOMO energy gap substantially larger than that of the adjacent organic semiconductor from which excitons are being blocked. The thus confined excitons are prohibited from existing in the EBL due to quantum energy considerations. While it is desirable for the EBL to block excitons, it is not desirable for the EBL to block all charge carrying quanta as well. However, due to the nature of the adjacent energy levels an EBL will necessarily block one sign of charge carrier. By design, an EBL will always exist between two adjacent layers, usually an organic photosensitive semiconductor layer and a electrode or charge transfer layer. The adjacent electrode or charge transfer layer will be in context either a cathode or an anode. Therefore, the material for an EBL in a given position in a device will be chosen so that the desired sign of carrier will not be impeded in its transport to the electrode or charge transfer layer. Proper energy level alignment ensures that no barrier to charge transport exists, preventing an increase in series resistance. It should be appreciated that the exciton blocking nature of a material is not an intrinsic property. Whether a given material will act as an exciton blocker depends upon the relative HOMO and LUMO levels of the adjacent organic photosensitive material. Therefore, it is not possible to identify a class of compounds in isolation as exciton blockers without regard to the device context in which they may be used. However, with the teachings herein one of ordinary skill in the art may identify whether a given material will function as an exciton blocking layer when used with a selected set of materials to construct an OPOD.

For example, FIGS. 2A through 2C illustrate three types of bilayer OPODs having one or more EBLs to suppress undesired exciton diffusion and enhance device efficiency. These figures schematically depict the relative energy levels of the various materials comprising various embodiments of an OPOD cell having one or more EBLs. The lines in each figure at the ends represent the work function of the electrodes or charge transfer layers at the ends. The shaded boxes represent the relative LUMO-HOMO energy gaps of the various constituent layers of the OPOD.

With regard to FIG. 2A, OPOD device 2A00 comprises an anode layer 2A01, such as indium tin oxide (ITO), a hole transporting layer (HTL) 2A02, such as CuPc which is believed to have a LUMO-HOMO separation of approximately 1.7 eV, an electron transporting layer (ETL) 2A03, such as PTCBI which is also believed to have a LUMO-HOMO separation of approximately 1.7 eV, an exciton blocking layer (EBL) 2A04, such as 2,9-dimethyl-4,7-diphenyl-1,10-phenanthroline (also called bathocuproine or BCP) which is believed to have a LUMO-HOMO separation of about 3.5 eV, and a cathode layer 2A05, such as silver. It should be appreciated that the larger LUMO-HOMO energy gap in EBL 2A04 will prohibit diffusion of excitons from ETL 2A03 into EBL 2A04. Also, coincidentally EBL 2A04 would block the transit of holes from ETL 2A03 toward the cathode due to the unfavorable gap between the HOMO levels of ETL 2A03 and EBL 2A04, i.e., the higher ionization potential of the EBL. However, this effect is thought to be of little consequence since the internal electric field generated around the HTL/ETL interface will tend to drive holes towards anode layer 1 so that there are relatively few holes near the ETL/EBL interfacial region. One result of this hole blocking aspect is that EBL 2A04 is optimally a cathode side EBL. Note also that there is incidentally a slightly unfavorable LUMO gap for electrons at the ETL/EBL interface in the illustrated example using PTCBI as the ETL and BCP as the EBL. Optimally, it is desirable for a material used as a cathode side EBL to have a LUMO level closely matching the LUMO level of the adjacent ETL material so that the undesired barrier to electrons is minimized.

With regard to FIG. 2B, the analogous situation of an anode side EBL is depicted. OPOD device 2B00 comprises an anode layer 2B01, such as indium tin oxide (ITO), an exciton blocking layer (EBL) 2B02, such as 4,4',4"-tris{N,-(3-methylphenyl)-N-phenylamino}triphenylamine (m-MTDATA) or polyethylene dioxythiophene (PEDOT). The LUMO-HOMO separations for m-MTDATA and PEDOT are not precisely known but believed to be such as depicted in FIG. 2B. The OPOD further comprises a hole transporting layer (HTL) 2B03, such as CuPc, an electron transporting layer (ETL) 2B04, such as PTCBI, and a cathode layer 2B05, such as silver. It should be appreciated that the larger LUMO-HOMO energy gap in EBL 2B02 will prohibit diffusion of excitons from HTL 2B03 into EBL 2B02. Also, coincidentally EBL 2B02 would block the transit of electrons from HTL 2B03 toward the cathode due to the unfavorable gap between the LUMO levels of HTL 2B03 and EBL 2B02, i.e., the higher LUMO level of the EBL. However, this effect is thought to be of little consequence since the internal electric field generated around the HTL/ETL interface will tend to drive electrons towards cathode layer 2B05 so that there are relatively few electrons near the HTL/EBL interfacial region. One result of this electron blocking aspect is that EBL 2B02 is optimally an anode side EBL.

Finally, in FIG. 2C, the various relative energy layers of an OPOD 2C00 having both anode side and cathode side EBLs is illustrated. An anode layer 2C01, such as ITO, an anode side EBL 2C02, such as m-MTDATA or PEDOT, a HTL 2C03, such as CuPc, an ETL 2C04, such as PTCBI, a cathode side EBL 2C05, such as BCP, and a cathode layer 2C06, such as silver. Accordingly, with both an anode side EBL and a cathode side EBL, excitons generated within HTL 2C03 and ETL 2C04 are effectively confined until they preferably dissociate or undesirably quench.

A multilayer structure like that whose energy state structure is depicted in FIG. 2D is a highly efficient photodetector. In FIG. 2D, 2D01 is a transparent anode, e.g., ITO, which is adjacent to one of several HTL, e.g., CuPc, layers 2D02. Between the HTL layers 2D02 and adjacent to exciton blocking layer 2D04 are several ETL, e.g., PTCBI, layers 2D03. Exciton blocking layer 2D04 is BCP in this example. Exciton blocking layer 2D04 is adjacent to cathode 2D05 which is, e.g., silver. Arbour et al and Forrest, Chem. Rev. 1997 suggested that the numerous HTL-ETL interfaces can provide efficient free carrier generation when a bias is provided to extract the carriers from the device. Arbour and Forrest did not, however, suggest the use of an exciton blocking layer as described herein to further enhance the efficiency in such devices.

OPODs operating without a bias and including an EBL in accordance with the present invention can be made very thin without severe loss of photocurrent. Accordingly, OPODs including EBLs may be used in combination with the highly efficient OPODs of the U.S. patent applications of Forrest et al., now Pat. Nos. 6,352,777, 6,297,495, 6,278,055, 6,198,092 and 6,198,091, (hereinafter collectively "Forrest OPOD Appls.") which are incorporated herein by reference in their entirety. Stacked OPODs including EBLs and having numerous subcells and/or including a waveguide configuration may be constructed in accord with the present invention to achieve high internal and external quantum efficiencies.

When the term "subcell" is used hereafter, it refers to an organic photosensitive optoelectronic construction which may include an exciton blocking layer in accordance with the present invention. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode or charge transfer layers. In other cases, adjacent subcells do not share common electrodes or charge transfer layers. The term "subcell" is disclosed herein to encompass the subunit construction regardless of whether each subunit has its own distinct electrodes or shares electrodes or charge transfer layers with adjacent subunits. Herein the terms "cell", "subcell", "unit", "subunit", "section", and "subsection" are used interchangeably to refer to a photoconductive layer or set of layers and the adjoining electrodes or charge transfer layers. As used herein, the terms "stack", "stacked", "multisection" and "multicell" refer to any optoelectronic device with multiple layers of a photoconductive material separated by one or more electrode or charge transfer layers.

Since the stacked subcells of the solar cell may be fabricated using vacuum deposition techniques that allow external electrical connections to be made to the electrodes separating the subcells, each of the subcells in the device may be electrically connected either in parallel or in series, depending on whether the power and/or voltage generated by the solar cell is to be maximized. The improved external quantum efficiency that may be achieved for stacked solar cell embodiments of the present invention may also be attributed to the fact that the subcells of the stacked solar cell may be electrically connected in parallel since a parallel electrical configuration permits substantially higher fill factors to be realized than when the subcells are connected in series.

Although the high series resistance of photoconductive organic materials inhibits use of subcells in a series configuration for high power applications, there are certain applications, for example, in operating liquid crystal displays (LCD), for which a higher voltage may be required, but only at low current and, thus, at low power levels. For this type of application, stacked, series-connected solar cells may be suitable for providing the required voltage to the LCD. In the case when the solar cell is comprised of subcells electrically connected in series so as to produce such a higher voltage device, the stacked solar cell may be fabricated so as to have each subcell producing approximately the same current so to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility. Accordingly, in addition to being capable of providing the maximum voltage that is generated across the entire set of subcells, an exemplary embodiment the stacked solar cells of the present invention may also be used to provide multiple voltages from a single power source by tapping a selected voltage from a selected subset of subcells.

Representative embodiments may also comprise transparent charge transfer layers. As described herein charge transfer layers are distinguished from ETL and HTL layers by the fact that charge transfer layers are frequently, but not necessarily, inorganic and they are generally chosen not to be photoconductively active.

Embodiments of the present invention may include, as one or more of the transparent electrodes of the optoelectronic device, a highly transparent, non-metallic, low resistance cathode such as disclosed in U.S. patent application Ser. No. 09/054,707 to Parthasarathy et al. ("Parasarathy '707") , or a highly efficient, low resistance metallic/non-metallic composite cathode such as disclosed in U.S. Pat. No. 5,703,436 to Forrest et al. ("Forrest '436"). Each type of cathode is preferably prepared in a fabrication process that includes the step of sputter depositing an ITO layer onto either an organic material, such as copper phthalocyanine (CuPc), PTCDA and PTCBI, to form a highly transparent, non-metallic, low resistance cathode or onto a thin Mg:Ag layer to form a highly efficient, low resistance metallic/non-metallic composite cathode. Parasarathy '707 discloses that an ITO layer onto which an organic layer had been deposited, instead of an organic layer onto which the ITO layer had been deposited, does not function as an efficient cathode.

It is an object of the present invention to provide an OPOD and an OPOD subcell comprising one or more exciton blocking layers to increase the internal quantum efficiency of the OPOD or OPOD subcell.

It is an object of the present invention to provide an OPOD capable of operating with a high external quantum efficiency and comprising stacked OPOD subcells.

It is another object of the present invention to provide a stacked OPOD capable of operating with an external quantum efficiency that approaches the maximum internal quantum efficiency of an optimal OPOD subcell.

Another object of the present invention is to provide an OPOD with improved absorption of incident radiation for more efficient photogeneration of charge carriers.

It is a further objective of the present invention to provide an OPOD with an improved $V_{oc}$ and an improved $I_{sc}$.

Another object of the present invention is to provide a stacked OPOD having parallel electrical interconnection of the subcells.

A further object of the present invention is to provide a stacked OPOD comprised of multiple organic OPOD subcells with transparent electrodes and having a substantially reflective bottom layer to increase overall electromagnetic radiation absorption by capturing the electromagnetic radiation reflected by the bottom layer.

A further object of the present invention is to provide a waveguide configuration OPOD having an exciton blocking layer.

Yet another object of the present invention is to provide OPODs including a conductive or an insulating substrate.

A further object of the present invention is to provide OPODs including a rigid or a flexible substrate.

A further object of the present invention is to provide OPODs wherein the organic materials used are polymeric or non-polymeric thin films.

BRIEF DESCRIPTION OF THE DRAWINGS

The foregoing and other features of the present invention will be more readily apparent from the following detailed description of exemplary embodiments taken in conjunction with the attached drawings.

FIGS. 2A–2C illustrate the relative energy levels in exemplary embodiments of the invention having a cathode side EBL, an anode side EBL, or both.

FIG. 2D illustrates the relative energy levels in an exemplary embodiment of a multilayer photodetector having an EBL on the cathode side.

FIG. 10 schematically depicts a stacked OPOD having an exciton blocking layer.

FIG. 11 depicts a waveguide type OPOD having an exciton blocking layer.

FIG. 12 is a top down view of FIG. 12 through line A—A.

DETAILED DESCRIPTION

Figure 3:
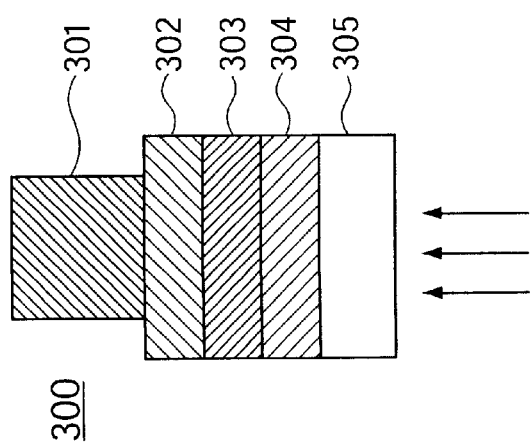
FIG. 3 depicts an exemplary OPOD in accord with the present invention.

Devices have been constructed and example data recorded for exemplary embodiments of the present invention, in particular, the device depicted in FIG. 3.

In FIG. 3, OPOD 300 has cathode 301 of a suitable electrode material such as silver, an EBL 302 of a suitable material such as BCP, an ETL 303 such as PTCBI, a HTL 304 such as CuPc, and an anode of a suitable electrode material such as ITO. In such a device at least one of the electrodes must be transparent to allow the admission of electromagnetic radiation. Hereafter, calculations and data are presented from actual devices and compared to prior art and theory. Other prospective embodiments of devices in accord with the present invention are also described.

Exemplary embodiments were fabricated on pre-cleaned glass substrates coated with a ~1500 Å thick transparent, conducting indium-tin-oxide (ITO) anode (with a sheet resistance of 40 Ω/sq.). Prior to deposition, the organic materials were purified in three cycles using thermal gradient sublimation. Films were grown onto the ITO employing ultrahigh vacuum ($1\times10^{-10}$ Torr) organic molecular beam deposition in the following sequence: 30 Å to 600 Å thick films of donor-like copper-phthalocyanine (CuPc) was followed by a 30 Å to 600 Å thick films of acceptor-like 3,4,9,10-perylenetetracarboxylic bisimidazole (PTCBI). Next, a 100 Å to 200 Å thick film of the bathocuproine (BCP) EBL was deposited. Here, BCP with a 3.5 eV energy gap, has previously been shown to be an effective exciton blocker which can easily transport electrons to the top 800 Å thick Ag cathode (evaporated at $1\times10^{-6}$ Torr, through a shadow mask with 1 mm diameter openings, in a separate vacuum chamber after exposing the organics to the atmosphere) from the adjoining PTCBI layer. All electrical measurements of the completed OPODs were performed in air unless otherwise specified.

Figure 1:
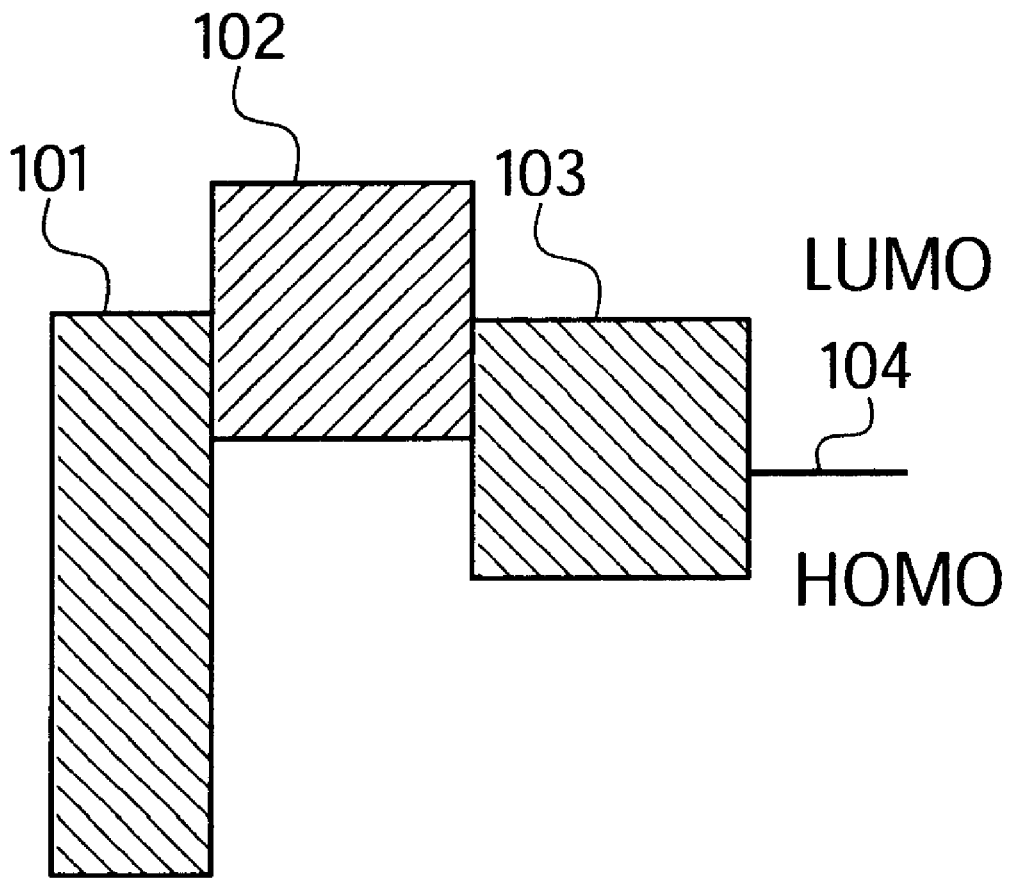
FIG. 1 illustrates the relative energy levels in a typical prior art device.
Figure 4:
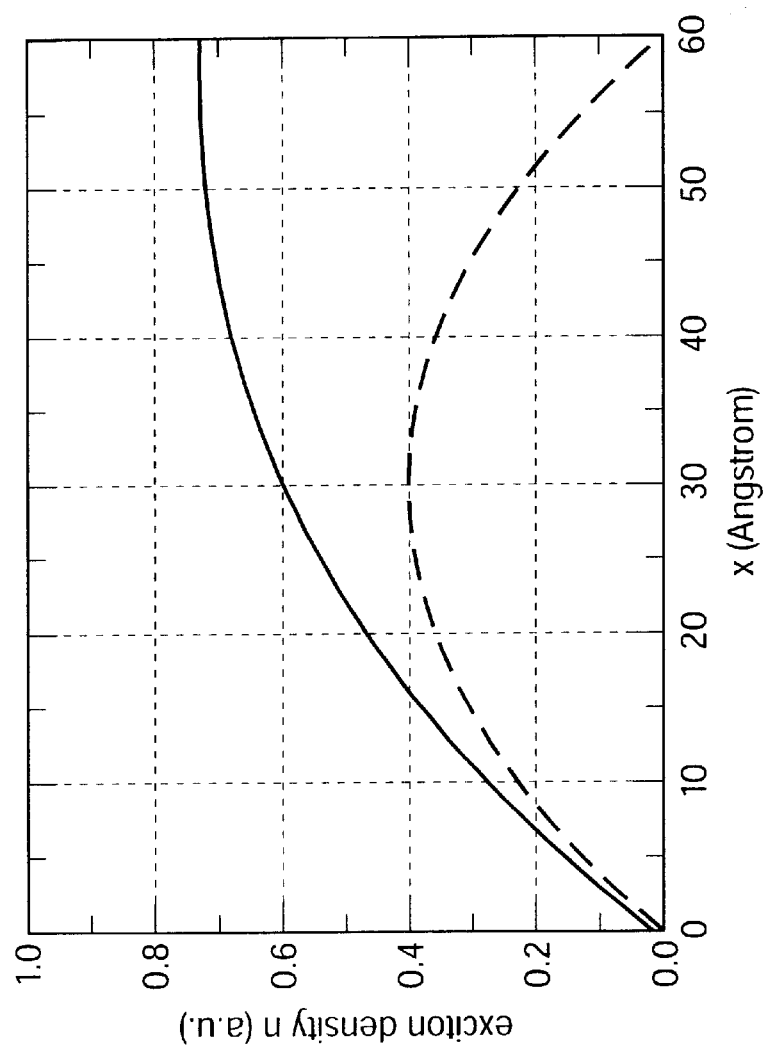
FIG. 4 is a graph of calculated exciton density profiles comparing the effect of an EBL with the effect of an exciton quenching interface.

FIG. 4 is a theoretical calculation of exciton density as a function of position in a photosensitive organic material under two different boundary conditions for the right interface. Both exciton profiles are for a 60 Å thick layer of an organic photosensitive material, e.g., PTCBI, assuming uniform generation of excitons throughout the film. The uniform generation follows from assuming $L_D \ll \alpha^{-1}$, i.e., the absorption length is much greater than the exciton diffusion length. Here, the exciton diffusion length, $L_D$, was taken to be 30 Å. The full line assumes an EBL to the right hand side. The dashed line has a quenching interface at the right hand side. In both cases, the left hand interface is the intentional exciton sink (for example the CuPc/PTCBI interface in embodiment 300). In a device in accordance with the present invention such as 300, excitons are purposefully lost at the exciton sink interface where they are converted to pairs of free charge carriers. The much higher value of the solid curve at the right end of the graph illustrates that the exciton recombination rate at the interface with the EBL is much lower and is preferably negligible.

Figure 5:
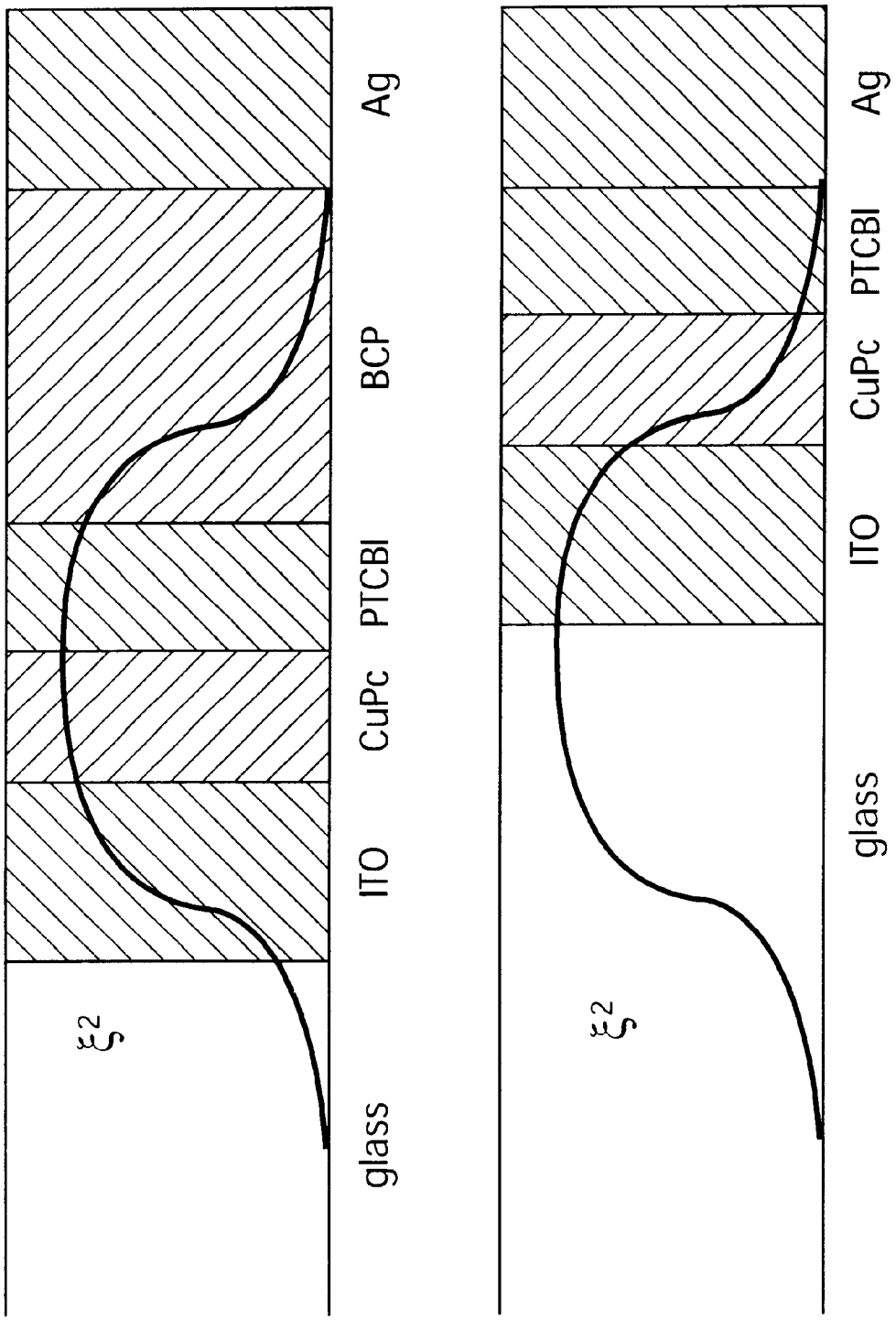
FIG. 5 depicts an effect of the eBL to shift the active region of exciton dissociation to the region of maximum optical electric field intensity.

FIG. 5 illustrates another beneficial attribute of an EBL in certain OPOD configurations. The active region is predicted to shift away from the region of vanishing optical electric field when an exciton blocking layer is inserted in an OPOD having a metallic back electrode, e.g., Ag. As can be seen from this graph, the insertion of an exciton blocking layer, e.g., BCP, effectively increases the average value of the square of the electric component of the optical field in the active regions of the device. The optical electric field profile depicted is conceptual and arises because of boundary conditions at the metallic interface which correspond to optical reflection. Note that the actual optical electric field profile will depend on the dielectric constant of the respective layers traversed by the incident light and varies for the different wavelengths of the incident radiation. While the details may vary, it is apparent that inserting an EBL layer in an exemplary device configuration, such as depicted in FIG. 5, provides some additional separation between the back reflecting electrode and the heterojunction. This is likely to put the heterojunction in a region of higher optical electric field. The shift of the optical electric field increases the absorption of the active layers, and hence the photon collection efficiency. This does not affect the internal quantum efficiency. However, in a device wherein the captured light is reflected multiple times through the photoactive layers, such as the waveguide configuration described later herein, it does affect the required number of passes the light must make to obtain high external efficiencies. In stacked devices which generally lack reflective layers, this absorption enhancement effect will not be present since the mean square value of the optical electric field will generally be a purely decaying function of the penetration depth into the device of the incident radiation.

Figure 6:
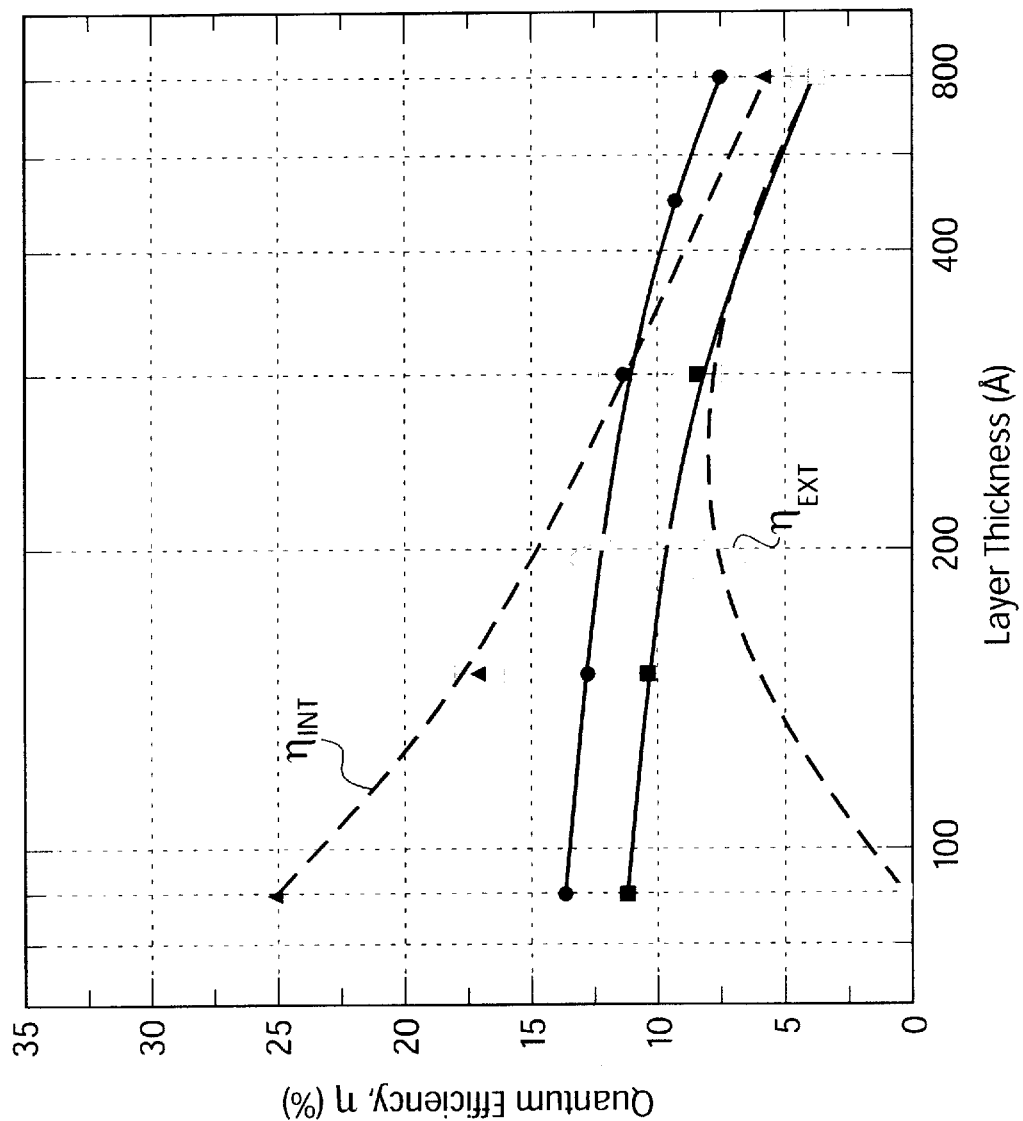
FIG. 6 is a graph of measured external quantum efficiency $\eta_{ext}$) at $\lambda=620$ nm of ITO/CuPc/PTCBI/BCP/Ag devices as a function of different layer thicknesses.

FIG. 6 shows the external quantum efficiency ($\eta_{next}$) at $\lambda$=620 nm (corresponding to an absorption peak of CuPc) of several exemplary devices embodying the present invention, e.g., ITO/CuPc/PTCBI/BCP/Ag, as a function of different layer thicknesses. For devices with 300 Å PTCBI and 100 Å BCP (filled circles), an increase in $\eta_{EXT}$ is observed as CuPc layer thicknesses is reduced. Similarly, for devices with 300 Å CuPc and 100 Å BCP (filled squares), an increase in $\eta_{EXT}$ is observed at $\lambda$=540 nm (an absorption peak of PTCBI) as the PTCBI layer thicknesses is reduced. If the BCP-EBL is omitted, the PV cell photocurrent response is significantly reduced for the thinnest cells, as shown for devices with 300 Å CuPc and a PTCBI layer of various thicknesses (open squares). Note that this BCP layer allows for the fabrication of devices with total active layer thicknesses of only 60 Å without electrical shorts. In addition, electrical measurements show that the series resistance of the cells remains unaffected for BCP layers as thick as 200 Å BCP. The monotonic increase of $\eta_{EXT}$, and the even greater increase of $\eta_{INT}$ with decreasing layer photoactive layer thicknesses in the presence of the EBL provide striking evidence that excitons must diffuse to the heterointerface for efficient dissociation and subsequent charge collection. The decreasing external quantum efficiency for thicker films is then solely due to the increased absorption in inactive regions (i.e. regions further than one diffusion length from the heterointerface). It is thought that in addition to keeping photogenerated excitons away from the quenching Ag interface, the EBL also helps prevent the incurrence of Ag clusters into the electron transport layer. Such clusters can cause shorting defects and provide additional quenching sites for excitons.

Figure 7:
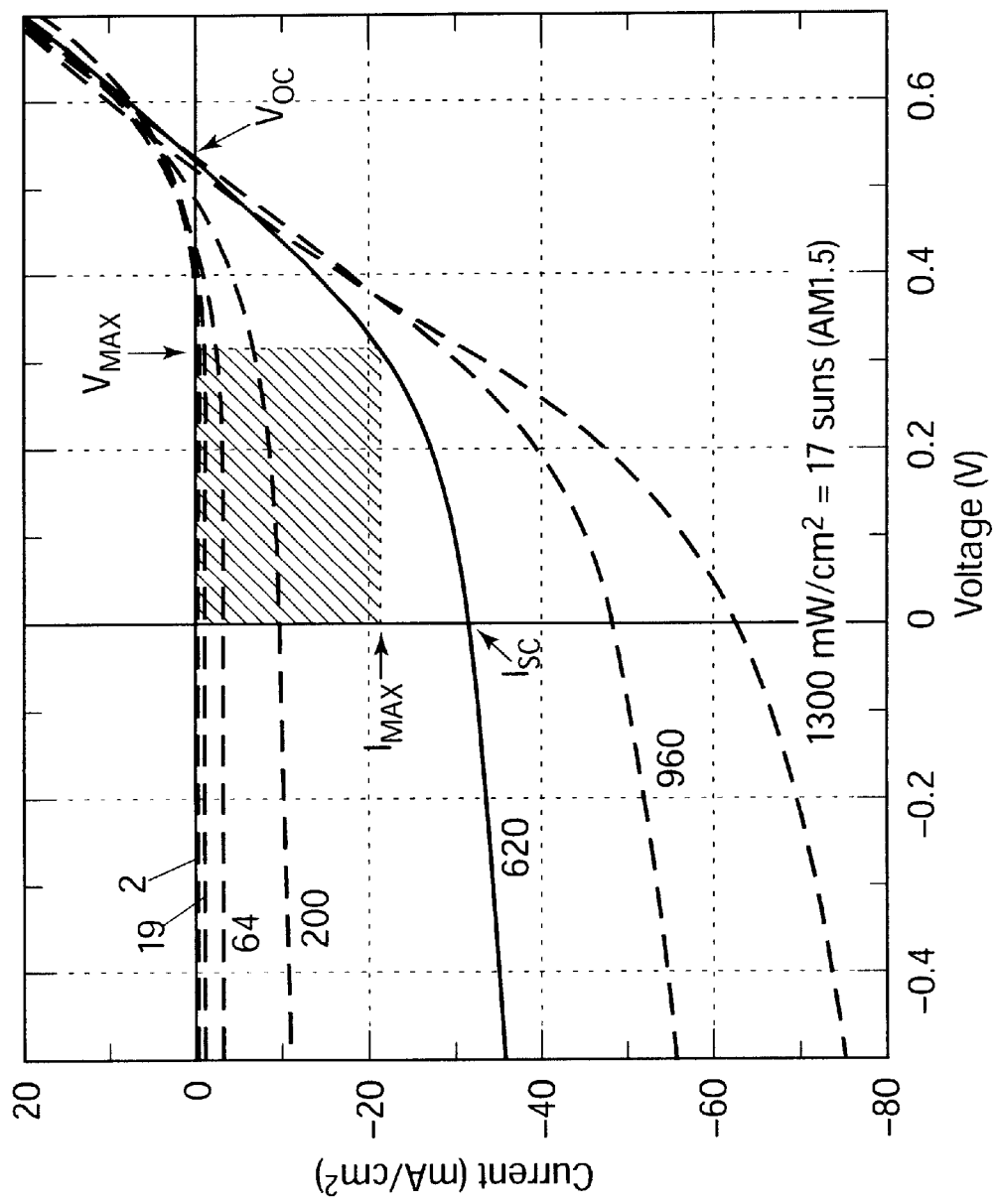
FIG. 7 is a graph of current vs. voltage (I-V) measurements of a thin device incorporating an EBL (ITO/150 Å CuPc/160 Å PTCBI/150 Å BCP:PTCBI/800 Å Ag) under different intensities of AM1.5 spectral illumination.
Figure 8A:
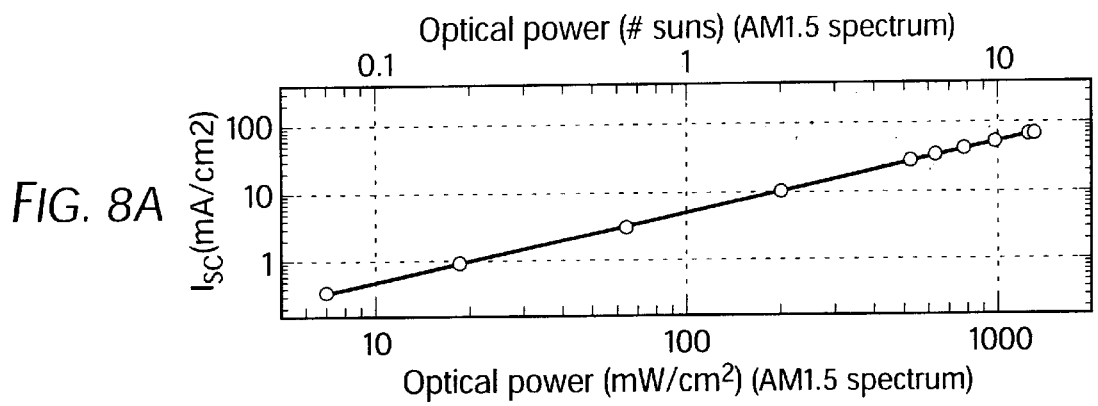
FIG. 8 illustrates an exemplary embodiment of a stacked OPOD in accord with the present invention.
Figure 8B:
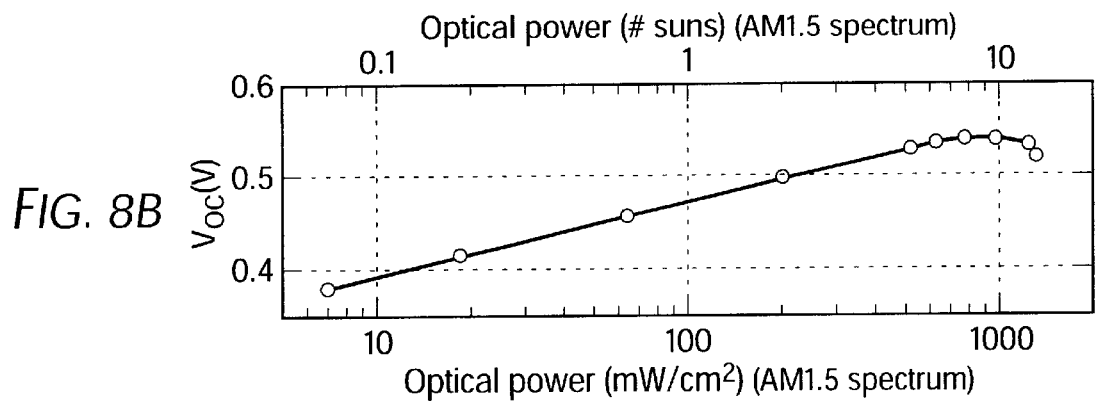
Figure 8C:
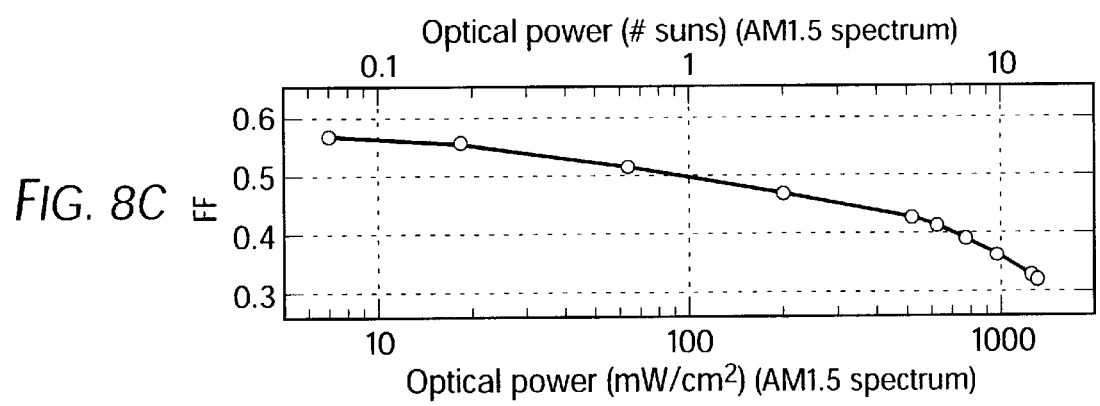
Figure 8D:
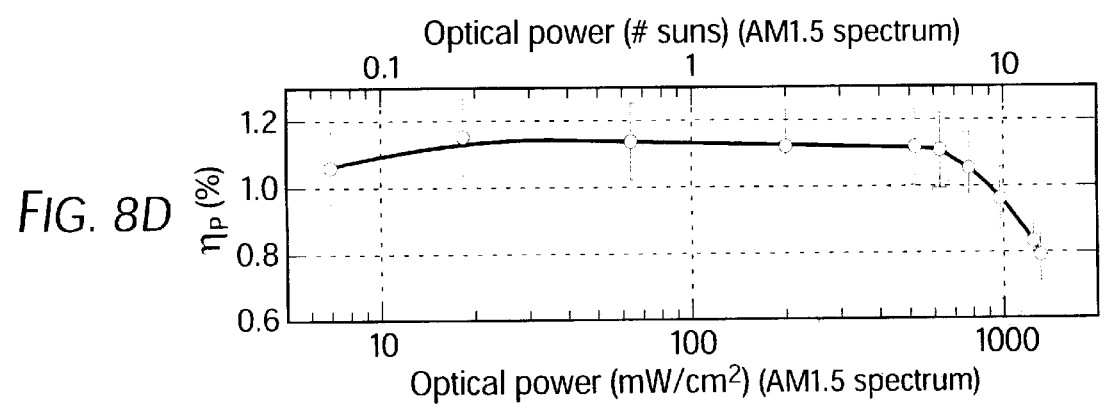

The current vs. voltage (I-V) measurements of another device in accord with the present invention, e.g., ITO/150ACuPc/60 Å PTCBI/150 Å BCP:PTCBI/800 Å Ag, under different intensities of AM1.5 spectral illumination are shown in FIG. 7. Simulated spectral illumination of variable intensity was obtained under a nitrogen ambient using a 150W Xe arc lamp equipped with AM1.5 and neutral density filters to attenuate the beam. (The optical power was measured using a calibrated Si photodiode from Newport, Inc. The Xe arc lamp was from Oriel.) The I-V response is characterized by a shunt resistance ($R_oA$, where A is the junction area) of 20±2k$\Omega$-cm$^2$, and a small series resistance of 30±10 $\Omega$-cm$^2$. The dark current follows the expression for a classical p-n junction diode with an ideality factor of n=1.4–1.7. These values compare favorably with amorphous silicon cells and are a significant improvement over previous reports of polymer thin film cells.

It should be appreciated that the BCP layer was doped with ~10% (by weight) of PTCBI. It is thought that the BCP as deposited in the present devices is amorphous. It is thought that good quality crystalline would also function as an EBL and might have better electron transport properties. However, it may be difficult or inefficient to prepare good crystalline material. The present apparently amorphous BCP exciton blocking layers do exhibit film recrystallization, which is especially rapid under high light intensities. The resulting morphology change to polycrystalline material results in a lower quality film with possible defects such as shorts, voids or intrusion of electrode material. Accordingly, it has been found that doping of some EBL materials, such as BCP, that exhibit this effect with a suitable, relatively large and stable molecule can stabilize the EBL structure to prevent performance degrading morphology changes. It should be further appreciated that doping of an EBL which is transporting electrons in a giving device with a material having a LUMO energy level close to that of the EBL will help insure that electron traps are not formed which might produce space charge build-up and reduce performance. Additionally, it should be appreciated that relatively low doping densities should minimize exciton generation at isolated dopant sites. Since such excitons are effectively prohibited from diffusing by the surrounding EBL material, such absorptions reduce device photoconversion efficiency.

The dependence of the performance parameters for an OPOD in accord with the present invention on the AM1.5 optical flux is shown in FIG. 8. The short-circuit current ($I_{sc}$) is linear with illumination intensity, indicating that even at the highest illumination levels of ~15 suns, no significant space charge build-up occurs. The open circuit voltage ($V_{oc}$) increases monotonically until it reaches a plateau of $V_{oc}$=0.54 V for illumination intensities >10 suns. The fill factor (ff), as defined in equation 1 and illustrated in FIG. 7, approaches 0.57 at low intensities, a value typical for conventional inorganic solar cells, and exceeds the typical value of ff<0.35 found in other organic PVs even at the highest illumination intensities considered. Since ff decreases with increasing $V_{oc}$ and light intensity, the external power conversion efficiency ($\eta_p$) at AM1.5 is only a slowly varying function of the illumination intensity, reaching a maximum of $\eta_p$=(1.1±0.1)% over a broad plateau extending from 0.1 to 10 suns. These results represent a significant improvement over previous demonstrations of thin film organic PV cells, and for the first time, efficient operation under simulated solar illumination of multiple suns is achieved without a decrease in power conversion efficiency.

Figure 9:
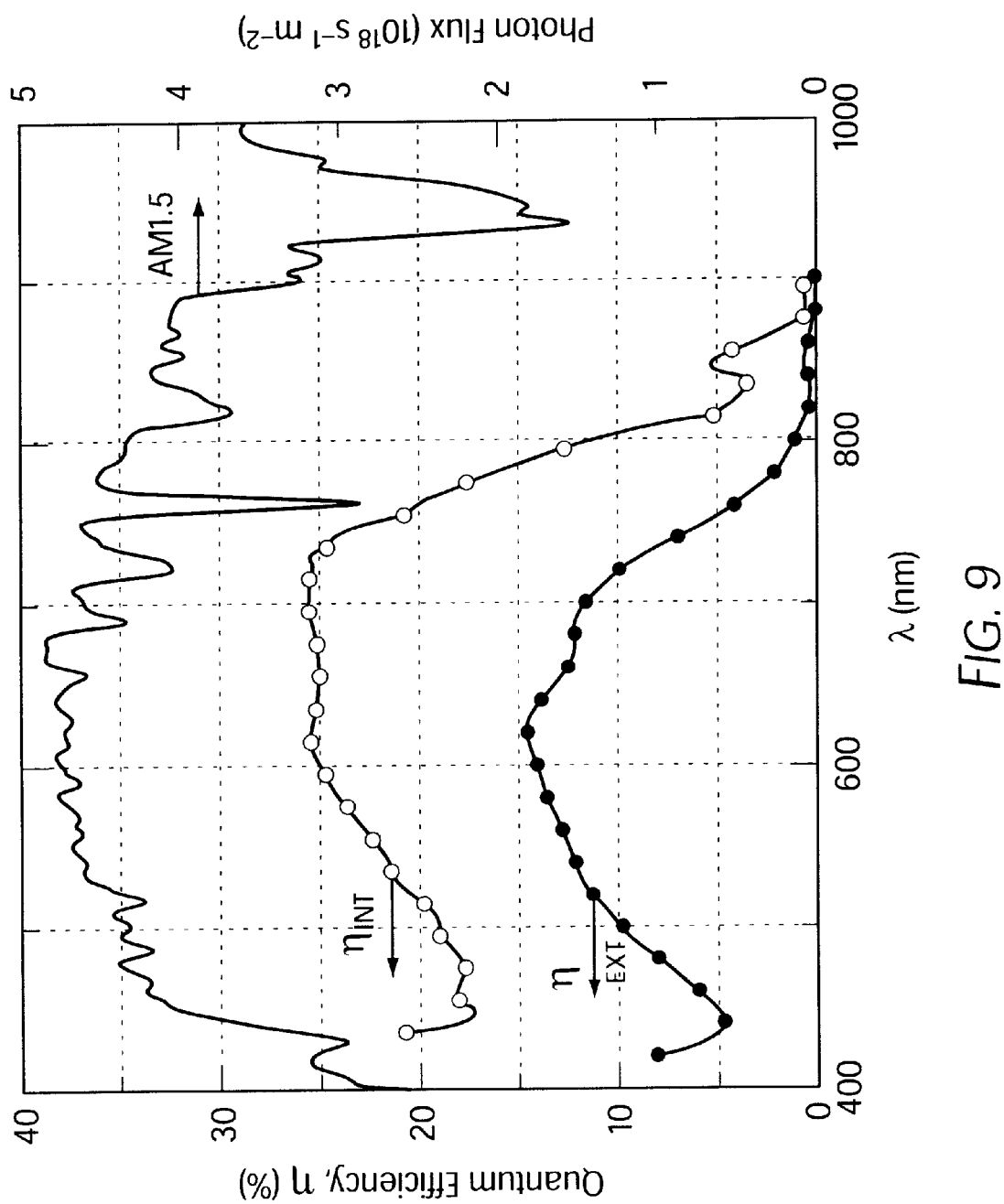
FIG. 9 illustrates an exemplary embodiment of a waveguide geometry type OPOD in accord with the present invention.

FIG. 9 shows the photocurrent action spectrum ($\eta_{EXT}$, solid circles) at zero bias (short circuit condition) of a device in accord with the present invention. The device structure was ITO/90 Å CuPc/90 Å PTCBI/100 Å BCP/Ag (a non-doped EBL). The excellent match of the action spectrum to the solar spectrum is apparent. The action spectrum also is well described by the sum of the absorption spectra of the organic films (weighted by the optical flux incident on each absorbing layer via the glass substrate), corroborating the assumption that the excitonic species is the intermediate state between photon absorption and the separated electron-hole pair. Now, $\eta_{EXT}$ is observed to increase linearly with reverse bias, with the slope of the photocurrent versus applied voltage dependent only on the PTCBI layer thickness. Further, the increase in $\eta_{EXT}$ follows the PTCBI absorption spectrum. Accordingly, the dependence of photocurrent on voltage is thought to be due to intrinsic photoconduction in PTCBI, i.e., exciton dissociation in the film bulk.

FIG. 9 also plots the spectral dependence of the calculated internal quantum efficiency ($\eta_{INT}$, open circles), with a maximum efficiency of 25% observed for PTCBI and CuPc thicknesses of 90 Å. It should be appreciated that an internal quantum efficiency of ~25% is consistent with analytical solutions to the exciton diffusion equation for the geometry of interest. This is a strong indication that the photon harvesting efficiency is limited only by exciton diffusion.

Due to the thin photoactive layers of the embodiments described so far, device geometries which provide a means for increasing the effective thickness of the absorbant layers are preferable. One such configuration is a stacked OPOD. A stacked OPOD 1000 comprising exciton blocking layers is schematically illustrated in FIG. 10. Layers 1001, 1003, 1005, and 1007 are electrodes or charge transfer layers which may be metal or metal substitutes as described above and in the Forrest OPOD Appls. Sections 1002, 1004 and 1006 represent photosensitive heterostructures such as those depicted in FIGS. 2A–2C which form OPOD subcells of the stacked OPOD 1000. Electrode or charge transfer layers 1003 and 1005 are preferably transparent while at least one of layers 1001 or 1007 is preferably transparent so that light incident upon either the uppermost or lowermost face of device 1000 will be admitted into the device for photoconversion. Layer 1008 is a conventional substrate material such as glass, metals, plastics, etc. The substrate is transparent when light is to be admitted through the substrate. Optionally, one of 1001 or 1007, may be reflective or an additional reflective layer may be added on the face opposite the incident light. Additional subcells may be incorporated in such a stacked structure. As described in the Forrest OPOD Appls., the subcells of device 1000 may be electrically connected in series or parallel or in combinations of series and parallel. Also, an exciton blocking layer may be incorporated into other heterostructure designs such as the unilayer and multilayer structures described in the Forrest OPOD Appls.

Alternatively, it is apparent from measurements of $\eta_{INT}$ that an increased $\eta_P$ can be achieved in a concentrator configuration where photons are forced to make multiple passes through the thin absorbing region. It should be appreciated regarding embodiment 1000 that light incident on a transparent face of the device can generally be reflected once off of an opposite interior reflecting layer and then either absorbed or possibly transmitted back out of the device. Device configurations are described in co-pending U.S. patent application No. 09/449,800, now U.S. Pat. No. 6,333,458, (incorporated herein by reference) which cause any light admitted to a device to be reflected multiple times to increase absorption efficiency.

A device in accord with the present invention (depicted in FIG. 11) having a reflective Ag layer 1101 with a small aperture on the substrate surface was used to demonstrate this increase in efficiency. Transparent layer 1102, of, for example, glass or plastic, was much wider than the optical coherence length. Transparent anode of degenerately doped ITO 1103 permitted the light to reach electronically active layers 1104. Metallic cathode 1105 reflected unabsorbed light. Concentrated radiation (10 suns at AM 1.5) was focused on an aperture in reflective layer 1101 and formed a near normal incidence beam which reflected several times between the cathode and Ag reflecting surface 1101, with each pass suffering additional absorption by a CuPc/PTCBI bilayer adjacent to a BCP EBL (shown collectively as 1104 and like FIG. 2A). FIG. 12 uses the same reference numerals as FIG. 11 to illustrate the circular aperture in reflective layer 1101 since layer 1102 can be seen through the aperture in this view of embodiment 1100 taken along line A—A in FIG. 11. Using this technique, an external power efficiency of $\eta_P$=2.4±0.3% was measured for a cell with 60 Å CuPc, 60 Å PTCBI and 150 Å BCP. This is believed to be the highest external power conversion efficiency at AM1.5 reported for an organic thin film photovoltaic cell. Note also that due to the small top electrode, not all of the incident radiation was trapped in this example. Hence, the power efficiency obtained represents a lower limit. By placing multiple, parallel connected cells (such as those disclosed in the Forrest OPOD Appls.) in a reflecting beam path, it is believed that, given a sufficient number of passes, efficiencies exceeding 3% can be achieved under improved light trapping. It should be appreciated that this device structure is particularly able to take advantage of the optical electric field enhancement depicted in FIG. 5.

It should also be appreciated that better control of the growth process would allow one to grow thinner, and thus more efficient devices. Further optimization of the transparency and reflectivity of the electrodes will reduce parasitic absorption. In addition, tuning the energy level alignment of the electron-donor and acceptor materials such that the binding energy of the exciton (~1eV) more closely matches the open-circuit voltage will further enhance device performance. It is believed that ~80% internal efficiencies, corresponding to ~8% power conversion efficiencies are within the reach of such optimized organic solar cells.

It should be appreciated that the advantages of an OPOD having an EBL in a waveguide type device were demonstrated using simulated concentrated sun light. Nonetheless, actual sun light can be concentrated and directed into the photoactive regions of an OPOD as described in U.S. Pat. No. 6,333,458.

Figure 13:
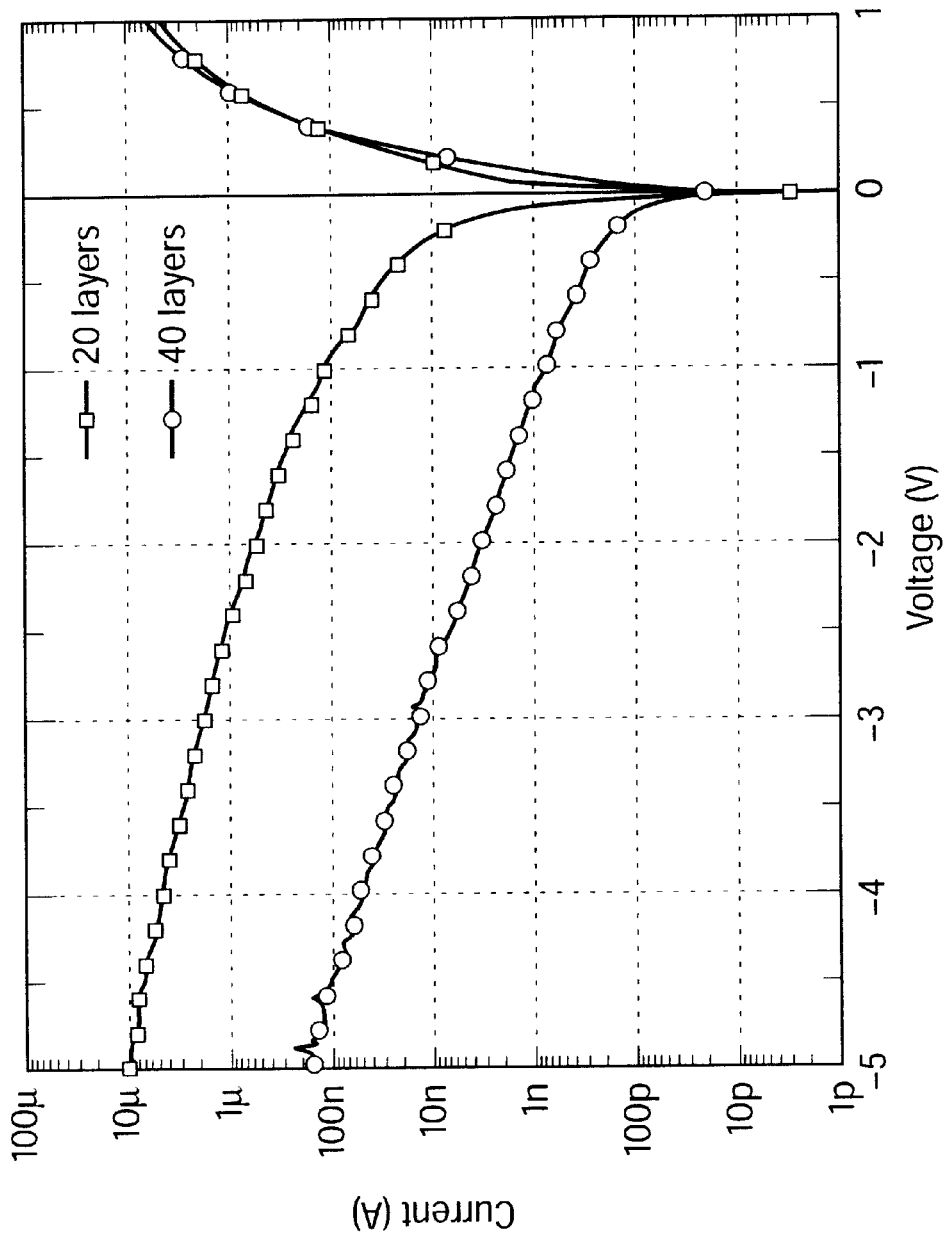
FIG. 13 is a graph of current/voltage characteristics of some multilayer photodetectors in accord with the present invention.
Figure 14:
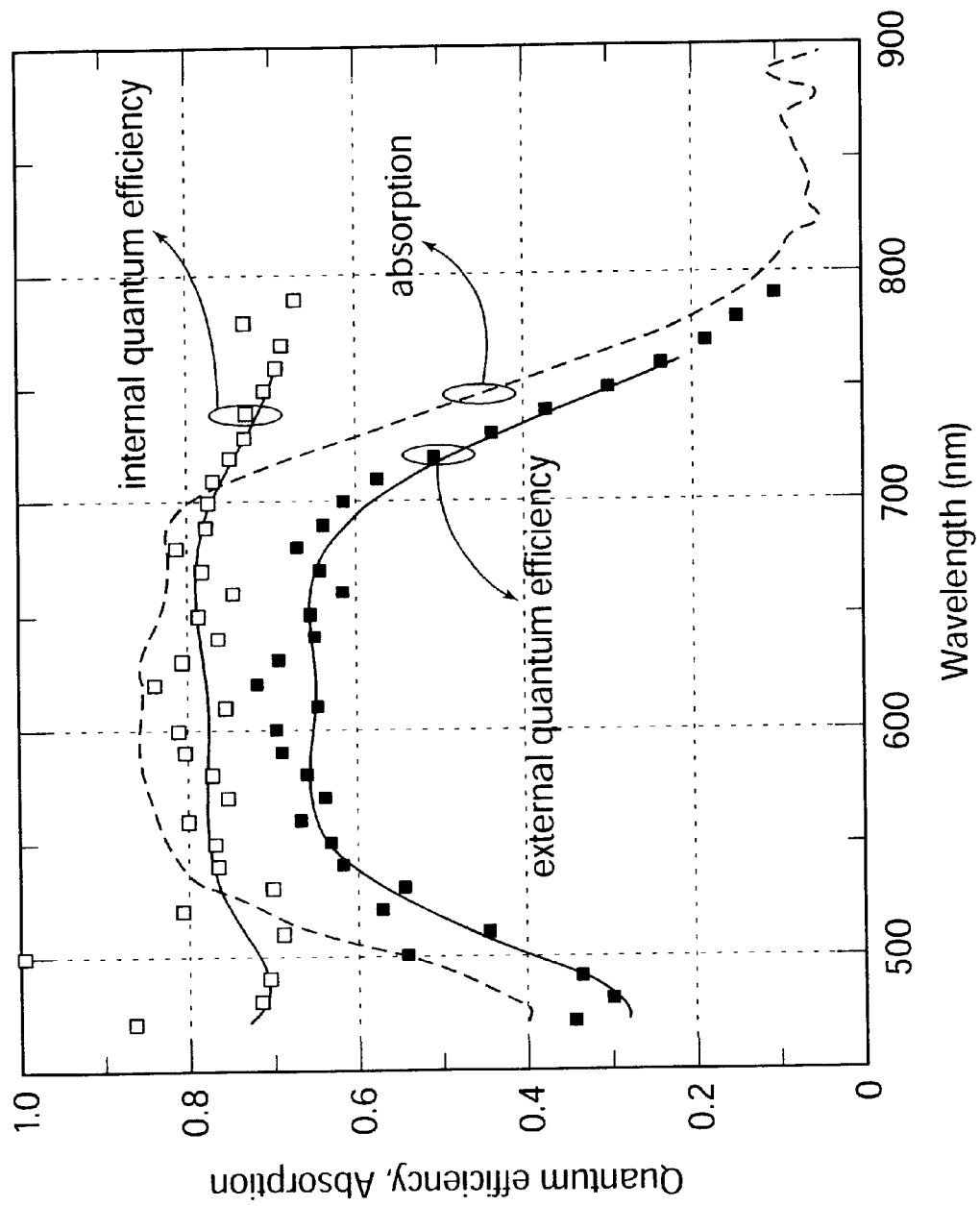
FIG. 14 is a plot of some efficiency and absorption data as a function of incident wavelength for a multilayer photodetector in accord with the present invention.
Figure 15:
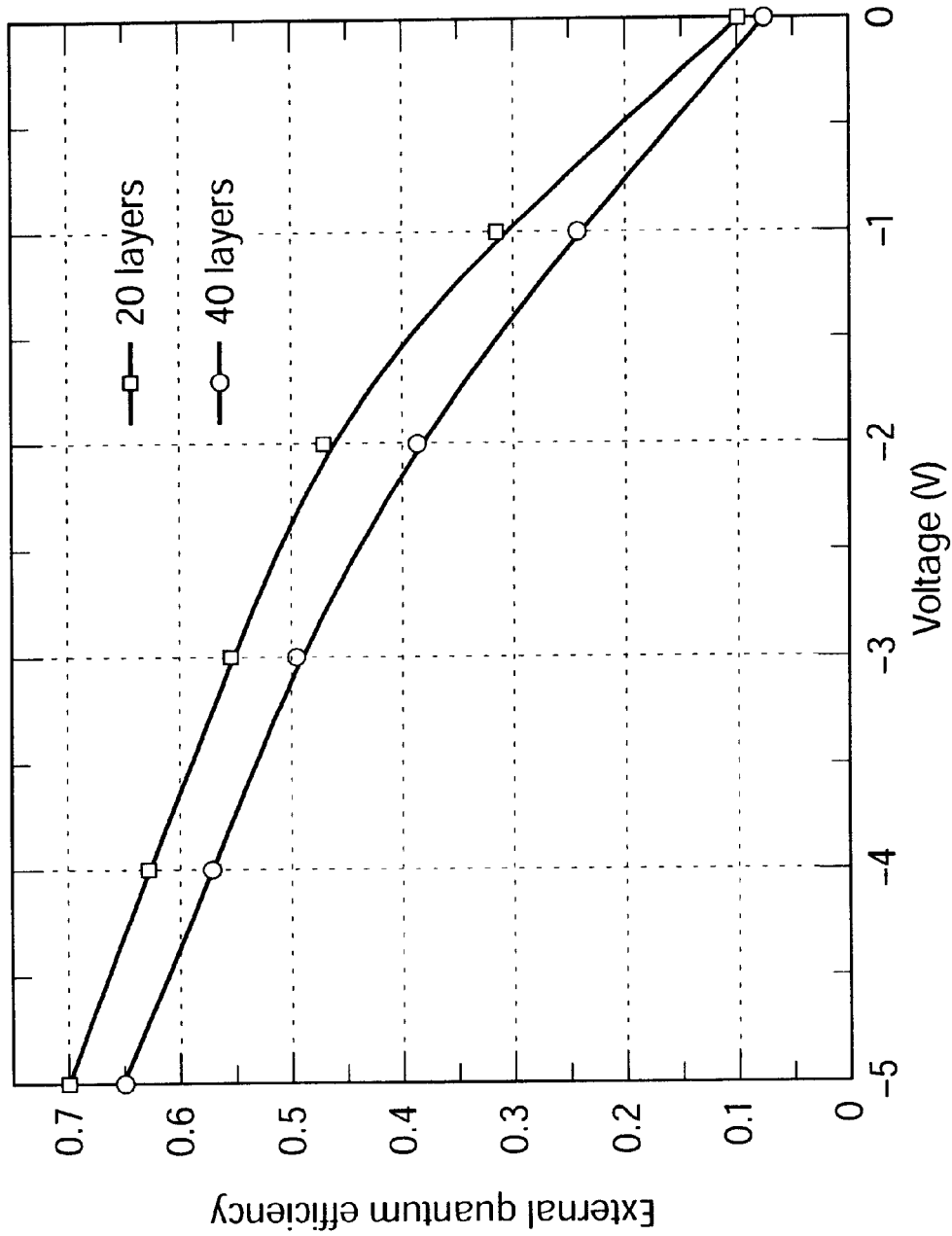
FIG. 15 is plot of external quantum efficiency as a function of voltage for some multilayer photodetectors in accord with the present invention.

FIGS. 13–15 illustrate data from examples of a multilayer photodetector having an EBL such as that of FIG. 2D. The HTL layer 2D02 adjacent an electrode and the ETL layer 2D03 adjacent an electrode are typically thicker than the multiple pairs of HTL/ETL layers in the device interior away from electrodes. Typically then, layer 2D02 adjacent cathode 2D05 is about 30–100 Å of CuPc. Similarly, layer 2D03 adjacent anode 2D01 is typically 30–100 Å of PTCBI. EBL 2D04 is, for example, 50–200 Å of BCP. The multiple pairs of HTL/ETL layers can have ETL and HTL layers having, e.g., 2–10 Å thickness, with the pairs repeated from 2 to 50 times. FIG. 13 shows current-voltage for a multilayer photodetector and shows in this example that 20 HTL/ETL pairs produces a higher current response that 40 such interfaces. FIG. 14 shows quantum efficiency and absorption data for such multilayer photodetectors and illustrates a broad flat spectral response. FIG. 15 shows external quantum efficiency data for photodetectors having 20 or 40 HTL/ETL pairs and that the 20 layer device has a higher external quantum efficiency. In the 20 and 40 pair photodetectors, the overall device thickness was not increased by the same factor as the number of pairs, i.e., 2 times, so the photosensitive layers forming the pairs were much thinner for the 40 pair device. It is believed that the current response and quantum efficiency were better for the 20 pair device, because the thinness of the HTL and ETL layers in the 40 pair device may have caused the layers to begin to lose their character as discrete layers. Instead it is believed that the materials forming the layers may have somewhat intermixed producing the somewhat poorer performance.

Thus, there has been described and illustrated herein an organic photosensitive optoelectronic device and method for producing the same. Those skilled in the art, however, will recognize that many modifications and variations besides those specifically mentioned may be made in the apparatus and techniques described herein without departing substantially from the concept of the present invention. Accordingly, it should be clearly understood that the form of the present invention as described herein is exemplary only and is not intended as a limitation on the scope of the present invention.

What is claimed is:

1. An organic photosensitive optoelectronic device comprising:
    two electrodes in superposed relation;
    a hole transport layer between the two electrodes, the hole transport layer formed of a first photoconductive organic semiconductor material;
    an electron transport layer between the two electrodes and adjacent to the hole transport layer, the electron transport layer formed of a second photoconductive organic semiconductor material; and
    at least one exciton blocking layer between the two electrodes and adjacent to at least one of the two electrodes.

2. The device of claim 1 wherein one exciton blocking layer is between the electron transport layer and the electrode adjacent the exciton blocking layer.

3. The device of claim 1 wherein one exciton blocking layer is between the hole transport layer and the electrode adjacent the exciton blocking layer.

4. The device of claim 1 wherein the at least one exciton blocking layer is a first exciton blocking layer and a second exciton blocking layer, the first exciton blocking layer being between the electron transport layer and the electrode adjacent the first exciton blocking layer, the second exciton blocking layer being between the hole transport layer and the electrode adjacent the second exciton blocking layer.

5. The device of claim 1 wherein the first photoconductive organic semiconductor material and the second photoconductive organic semiconductor material are selected to have spectral sensitivity in the visible spectrum.

6. The device of claim 2 wherein:
    the electron transport layer is 3,4,9,10-perylenetetracarboxylic-bis-benzimidazole (PTCBI);
    the hole transport layer is copper phthalocyanine (CuPc); and
    the exciton blocking layer is 2,9-dimethyl-4,7-diphenyl-1,10-phenanthroline (BCP).

7. The device of claim 3 wherein: the electron transport layer is 3,4,9, 10-perylenetetracarboxylic-bis-benzimidazole (PTCBI);
    the hole transport layer is copper phthalocyanine (CuPc); and
    the exciton blocking layer is selected from the group consisting of 4,4',4"-tris {N,-(3-methylphenyl)-N-phenylamino}triphenylamine (m-MTDATA) and polyethylene dioxythiophene (PEDOT).

8. The device of claim 1 wherein the electron transport layer, the hole transport layer, and the at least one exciton blocking layer are disposed between two parallel planar reflective surfaces which form a waveguide.

9. The device of claim 8 wherein one of the two reflective surfaces has an aperture to admit light incident upon the device.

10. The device of claim 8 having a transparent opening between the two reflective surfaces so that light is admitted to the device from a direction parallel to the planes of the reflective surfaces.

11. A stacked organic photosensitive optoelectronic device comprised of a plurality of photosensitive optoelectronic subcells wherein at least one subcell comprises:
    two electrodes in superposed relation;
    a hole transport layer between the two electrodes, the hole transport layer formed of a first photoconductive organic semiconductor material;
    an electron transport layer between the two electrodes and adjacent to the hole transport layer, the electron transport layer formed of a second photoconductive organic semiconductor material; and
    at least one exciton blocking layer between the two electrodes and adjacent to at least one of the two electrodes.

12. The device of claim 11 wherein the electron transport layer includes 3,4,9, 10-perylenetetracarboxylic-bis-benzimidazole (PTCBI) and the hole transport layer includes copper phthalocyanine (CuPc).

13. The device of claim 11 wherein the at least one exciton blocking layer includes 2.9-dimethyl-4,7-diphenyl-1,10-phenanthroline (BCP) and is between the electron transport layer and the electrode adjacent the at least one exciton blocking layer.

14. The device of claim 11 wherein the at least one exciton blocking layer is selected from the group consisting of 4,4',4"-tris{N,-(3-methylphenyl)-N-phenylamino}triphenylamine (m-MTDATA) and polyethylene dioxythiophene (PEDOT), and is between the hole transport layer and the electrode adjacent the at least one exciton blocking layer.

15. An organic photodetector comprising:
    a cathode and an anode in superposed relation;
    a plurality of pairs of a hole transporting layer adjacent to an electron transporting layer, the pairs disposed between the cathode and the anode; and
    an exciton blocking layer disposed between one of the cathode and the anode, and the plurality of pairs.

16. The photodetector of claim 15 wherein the exciton blocking layer is disposed between the anode and the plurality of pairs.

17. The photodetector of claim 15 wherein the exciton blocking layer is disposed between the cathode and the plurality of pairs.

18. The photodetector of claim 15 wherein the exciton blocking layer comprises 2,9-dimethyl-4,7-diphenyl-1,10-phenanthroline (BCP).

19. The photodetector of claim 15 wherein the exciton blocking layer is selected from the group consisting of 4,4',4"-tris{N,-(3-methylphenyl)-N-phenylamino}triphenylamine (m-MTDATA) and polyethylene.

20. The photodetector of claim 15 wherein the hole transporting layers and the electron transporting layers of the plurality of pairs are selected to have spectral sensitivity in the visible spectrum.

21. The photodetector of claim 15 wherein each hole transporting layer comprises copper phthalocyanine (CuPc) and each electron transporting layer comprises 3,4,9, 10-perylenetetracarboxylic-bis-benzimidazole (PTCBI).

22. The photodetector of claim 15 wherein the plurality of pairs is at least 5 pairs.

23. The photodetector of claim 15 wherein the plurality of pairs is at least 10 pairs.

24. The photodetector of claim 15 wherein the exciton blocking layer is disposed between the anode and the plurality of pairs and a second exciton blocking layer is disposed between the cathode and the plurality of pairs.

* * * * *

UNITED STATES PATENT AND TRADEMARK OFFICE
CERTIFICATE OF CORRECTION

PATENT NO.    : 6,451,415 B1
DATED         : September 17, 2002
INVENTOR(S)   : Forrest et al.

It is certified that error appears in the above-identified patent and that said Letters Patent is hereby corrected as shown below:

Column 12,
Line 63, change "heteroj unction" to -- heterojunction --;
Line 64, change "heteroj unction" to -- heterojunction --;

Column 15,
Line 24, change "Appis." to -- Appls. --; and

Column 18,
Line 65, change "t he" to -- the --.

Signed and Sealed this

Fifteenth Day of April, 2003

JAMES E. ROGAN
*Director of the United States Patent and Trademark Office*